US006560289B1

(12) United States Patent  (10) Patent No.: US 6,560,289 B1
Hellriegel  (45) Date of Patent: May 6, 2003

(54) MULTI-TICK TRANSMISSION LINE AND DATA STORAGE ELEMENT

(75) Inventor: Steven V. R. Hellriegel, Bainbridge Island, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/221,297

(22) Filed: Dec. 23, 1998

(51) Int. Cl.$^7$ ............................. H04B 3/00; H04L 25/00
(52) U.S. Cl. ...................................... 375/257; 375/377
(58) Field of Search ............................. 375/257, 377; 714/18, 15, 16

(56) References Cited

U.S. PATENT DOCUMENTS

| | | | | |
|---|---|---|---|---|
| 4,510,594 A | * | 4/1985 | Johnson, Jr. | 370/249 |
| 4,749,888 A | * | 6/1988 | Sakai et al. | 326/4 |

OTHER PUBLICATIONS

Gail Alverson et al., "Tera Hardware–Software Corporation", in *Proceedings of Supercomputing*, Nov. 1997.
Gail Alverson et al., "Scheduling on the Tera MTA" in *Job Scheduling Strategies for Parallel Processing, 949:of Lecture Notes in Computer Science, Springer–Vertag*, 1995.
Robert Alverson et al., "The Tera Computer System", in *Proceedings of 1990 ACM International Conference on Supercomputing*, pp. 1–6, Jun. 1990.
D.H. Bailey et al., "The NAS Parallel Benchmarks—Summary and Preliminary Results", in *Proceeding of Supercomputing '91*, pp. 158–165, Nov. 1991.
David Callahan, Recognizing and Parallelizing Bounded Recurrences, in *Languages and Compilers for Parallel Computing, 589:of Lecture Notes in Computer Science*, pp. 169–185, Springer–Verlag, 1992.
David Callahan et al., "Improving Register Allocation for Subscripted Variables", in *Proceedings of the ACM SIGPLAN '90 Conference on Programming Language Design and Implementation, SIGPLAN Notices*, 25(6):53–65, Jun. 1990.
David Callahan and Burton Smith, "A Future–based Parallel Language For a General–purpose Highly–parallel Computer", in *Languages and Compilers for Parallel Computing*, pp. 1–31, 1990.
Mark Linton, "The Evolution of Dbx", in *USENIX Summer Conference*, 1990.
Roy F. Touzeau, "A Fortran Compiler for the FPS–164 Scientific Computer", in *Proceedings of the ACM SIGPLAN '84 Symposium on Compiler Construction, SIGPLAN Notices* 19(6):48–57, Jun. 1984.

* cited by examiner

*Primary Examiner*—Stephen Chin
*Assistant Examiner*—David B. Lugo
(74) *Attorney, Agent, or Firm*—Harold H. Bennett, II; Seed IP Law Group

(57) ABSTRACT

A device and method for initializing the state of a computer, including individual transmission lines within the computer. A signal sending circuit provides an output signal onto a transmission line. While the signal is propagated along the transmission line, a second signal is provided in series on the same transmission line. Simultaneously therewith, the value of the first signal is stored in a data storage element. Subsequent bits may be placed on the transmission line before the first bit is received at a second end of the transmission line. Each bit placed on the transmission line is stored in a respective data storage element. The value of the data in the data storage elements can be tested to determine the exact state of any transmission line in the system. In addition, if operation of the transmission line is interrupted or terminated for any reason since the data is stored which was propagating along the transmission line, this data can be read onto the same transmission line, onto a subsequent transmission line, to reinitialize a transmission line within the system to have the exact value as that held at the time of termination of the operation. Operation can then resume on the next clock cycle and the machine will be at an exact known state or, in one embodiment, each node of the entire machine will be in exactly the same state as when the operation was terminated.

9 Claims, 2 Drawing Sheets

MULTI-TICK TRANSMISSION LINE AND DATA STORAGE ELEMENT

TECHNICAL FIELD

This invention relates to the loading of data bits on a transmission line, and particularly, to the loading of bits on the transmission line faster than they can propagate down the transmission line and the simultaneous storage of the bits being placed onto the transmission line.

BACKGROUND OF THE INVENTION

The speed at which computers operate has been increasing over the years. Some conventional computers which can be purchased on the consumer market presently have clock speeds in the range of 300 MHz and higher. This clock speed generally indicates the rate at which the microprocessor can be clocked. Some computers, particularly super computers, operate at much faster speeds. Clock rates in the gigahertz, terahertz, or even higher range are possible on some machines. However, as the clock rate of the microprocessor increases, other components in the system may limit the speed with which operations can be carried out, or data transferred from one microprocessor in the system to a second microprocessor or other component in the system. For example, a data bus, whether parallel or serial, may not be able to operate at the same high rate of speed as the microprocessor clock. Accordingly, the transfer of information to or from the microprocessor can occur only as quickly as the communication link to that microprocessor under current technology.

A still further problem with current technology is the difficulty of determining the state of various nodes within the entire computer system. For example, when a microprocessor starts, a large number of cycles may be required for signals to be propagated throughout the system to set all other microprocessors and communication nodes in the system to a desired value. After the desired value has been established, then operation of the system can proceed. However, a certain amount of time is required in current systems before it can be determined that each electrical node in the system is at the desired value so that communication to and from separate parts of the system can proceed at a high rate of speed.

SUMMARY OF THE INVENTION

According to principles of the present invention, a circuit is provided for storing data bits as they are placed onto a transmission line. The bits are placed onto the transmission line at a higher frequency than the bits are capable of traveling the length of the line. A storage device retains the bits while they are propagating on the transmission line. Thereafter, the bits on the transmission line can be loaded on the transmission line to place the entire line at the same state it held at a prior time. This can be used to initialize the transmission line to a known state. Further, the data can be read from the data storage device to test the data present on the transmission line.

The invention can be understood by looking at the simple example of a data bus composed of a single line having a selected length. A single transmission line is thus a simple example of a data bus. All transmission lines that carry data from one part of computer to another part of the computer have a selected length. In a small computer, particularly within a single microprocessor chip, such transmission lines may be extremely short and measured in millimeters, micrometers, or shorter. Transmission lines that carry the data from outside the chip to the input of another chip may also have varying lengths. If the chips are adjacent each other on a single board, length may be in the range of millimeters or centimeters. For longer transmission lines, particularly those used in a supercomputer which has many microprocessors operating in parallel and passing data to many parts of the machine, the length of the transmission line may be measured in meters, for example, 0.5 meters long, and, in some instances, up to a full meter or longer.

When a data bit is placed at one end of the transmission line, a certain amount of time is required for the data bit to pass from a first end of the transmission line to a second end of the transmission line. Even though data bits may travel at the speed of light along the transmission line, it still requires a finite time for the value placed at one end of the transmission line to transfer along the length of the transmission line until the second end of the transmission line also changes the value of the bit.

According to principles of the present invention, a first bit is placed on a first end of the transmission line. The bit passes through an output driver and begins to propagate along the transmission line. A second bit is then placed on the transmission line at the next clock pulse before the first bit has had sufficient time to propagate to the second end of the transmission line. The transmission line thus has two data bits propagating down it at the same time, of different states, one slightly ahead of the other in time. Simultaneously with the second data bit being clocked onto the transmission line, the value of the first data bit is stored in a data storage element. Subsequently, additional data bits are clocked onto the transmission line and simultaneously therewith each data bit presently at the input of the transmission line is stored in the data storage element. A series of data storage elements are provided to permit storage of as many bits as desired, usually, the number being selected to match the number of bits which can be held on the transmission line.

The state of the transmission line itself, as well as the state of its input and the state of its output, can be determined. The value in the data storage elements can be scanned out to test the value on the transmission line at any given time. In addition, the value in the data storage elements can be scanned into the transmission line again, or into a different transmission line in order to initialize the state of transmission lines in the system to a desired value. The invention provides the distinct advantage that the state of each electrical node in the system, including the transmission lines themselves, can be stored at any given moment and also initialized to any desired value at the start of the operation of the computer.

DETAILED DESCRIPTION OF THE INVENTION

Figure 1:
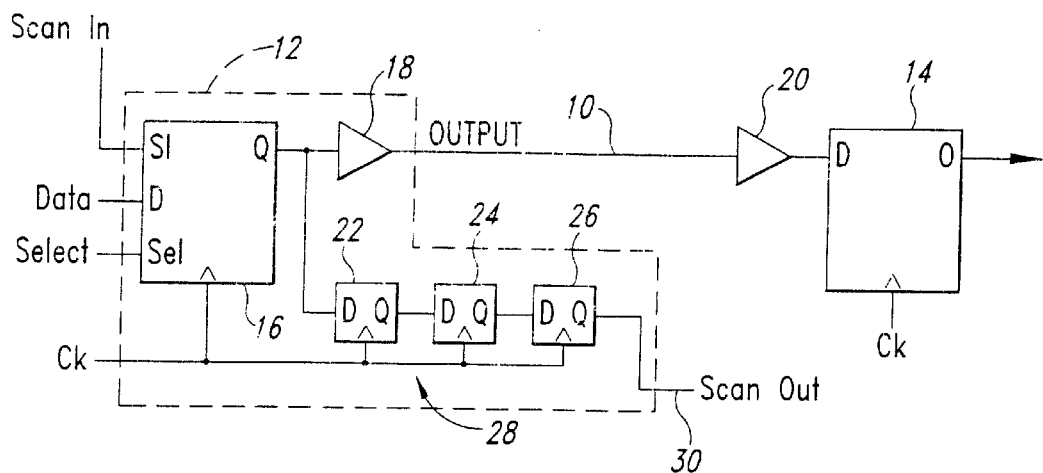
FIG. 1 is a block diagram of a transmission line and data storage device according to principles of the present invention.

FIG. 1 shows an example of a circuit for carrying out the present invention. FIG. 1 includes a transmission line 10 for carrying data from an output circuit 12 in the computer to a second circuit 14 within the computer. The transmission line 10 is shown as a single wire data bus, but can be many wires, transmitting in parallel. The wire in a preferred embodiment is composed of an alloy of primarily of copper, though of course, other transmission lines could be used including aluminum, fiber-optic cables, or other lines capable of carrying data from one circuit 12 to a second circuit 14.

The output circuit 12 places data onto the transmission line 10. It propagates along transmission line 10 and is received by receiving circuit 14. If the length of transmission line 10 is known, then the time required for propagation of a signal from the input of the transmission line to its output can be determined.

The clock rate of clock CK as shown in FIG. 1 determines the rate at which data is clocked out of the drive circuit and onto the transmission line 10. Each clock cycle, new data is provided on the output of the circuit 12. For high clock speeds, the data is outputted at a rate faster than it can propagate along the length of the transmission line 10. Accordingly, after a first bit is placed on the transmission line 10, a second bit may be placed onto the transmission line 10 prior to the first bit having been received by the receiving circuit 14.

A sending circuit 16 receives a data signal D provided as an input. A scan in signal SI also provides an input to the sending circuit 16. The clock CK transfers the data on one of the inputs to the output Q, the transfer of new data occurring on each clock in the cycle. A select line SEL determines whether the signal present on the scan in line or the signal present on the data line is provided on the output Q. For a first state of the select signal, the signal on the scan in line is provided as the output and for a second state of a select line, the signal present on the data input line is provided on the output.

At each clock, the data is provided at the output Q and presented to the input of a line driver 18. The line driver is not clocked and therefore immediately upon receiving a signal at its input, provides the signal as its output. The line driver 18 amplifies the signal sufficient for it to pass the length of transmission line 10. Thus, in its simplest form, the line driver 18 is a simple current or voltage amplifier. Of course, the line driver 18 could be an inverter circuit or any other acceptable circuit, output line drivers being well known in the art. Immediately upon the signal being provided at the output of the line driver 18, it begins to propagate along transmission line 10. In one embodiment, the signal is a digital bit, having a state of either a 0 or a 1, depending on the value of the output signal. The signal thus begins to propagate along the length of transmission line 10 towards the input driver 20 for the receiving circuit 14. While the bit is propagating along transmission line 10, and before it reaches the input driver 20, another clock cycle occurs presenting new data at the output Q of the sending circuit 16. Simultaneously therewith, flip-flops 22, 24, and 26 are clocked so that the data present at the input of flip-flop 22 is stored therein and is also provided at its output, Q. The flip-flop 22 stores the value at its input upon the receipt of the clock signal. The value at its input will be the value most recently placed on the data transmission line so that the first bit, which has been placed on the data transmission line, is stored in the first flip-flop 22 simultaneously with the next clock cycle.

When the second data bit is provided to the input of line driver 18, it is amplified and provided on the transmission line 10 and thus begins to propagate down the transmission line sequentially following the first bit. The second bit may be of a different value than the first bit. For example, in the case of a digital communication system, the first bit may be a 1 and the second bit a 0.

On the third clock cycle, a third data bit is provided at the output Q of the sending circuit 16. Simultaneously therewith, the state of the second bit is clocked into and stored in flip-flop 22 and the state of the first bit is clocked into and stored in flip-flop 24. The third bit is thereafter provided at the input of the line driver 18, appropriately amplified and begins to propagate along the transmission line 10. A fourth clock signal then occurs, placing the fourth data bit at the input of the line driver 18 and transferring the bits to the next flip-flop so that the first bit is stored in flip-flop 26, the second in flip-flop 24, and the third in flip-flop 22. The fourth bit then begins to propagate down the transmission line.

Assuming that the transmission line has a propagation time of four clock cycles, the first bit will now be reaching the input driver 20. The input driver 20 will provide the value of the first bit to the input pin D of the receiving circuit 14. Upon occurrence of the fifth clock signal, the data of the first bit is provided to and stored in the receiving circuit 14. A fifth bit is also placed on the input of the transmission line from the sending circuit 16. Further, each bit in the flip-flops 22, 24, and 26 advances one stage each clock cycle since all circuits are controlled by the same clock pulse operating at the same frequency.

In the present example, the transmission line 10 is a 4-tick wire, namely, it takes the same time as four clock cycles for a bit placed at the input of the transmission line to propagate down to the output of the transmission line. The transmission line is not clocked, so data bits travel along it as rapidly as possible, at the speed of electricity, which is at or near the speed of light. Of course, the time in clock cycles taken for the bits to travel the length of the line depends on the clock rate of bits onto the transmission line and the length of the transmission line as well as the propagation speed of bits along the line. Each of these can be measured and controlled so that the transmission line 10 has a predetermined number of data bits which are propagating thereon simultaneously with each other and which will be known to arrive at particular time at the receiving circuit 14.

The number of flip-flops 22, 24, and 26 is selected to be equal to the number of data bits minus one simultaneously propagating along the transmission line 10. Thus, if the transmission line 10 is a 4-tick wire, then three flip-flops are provided. If it is a shorter wire, such as a 3-tick wire, then only two flip-flops are provided, and if it is a 7-tick wire, then six flip-flops are provided. Of course, flip-flops are shown as only one example of acceptable data storage elements and any appropriate data storage element may be used with the data being clocked therein at the same rate as it is being placed onto the transmission line so that the data in the storage device matches exactly the data which is presently propagating along the transmission line 10.

Upon receipt of the first bit at the second end of the transmission line 10, the clock cycle which clocks it into the receiving circuit 14 also clocks the first bit out of the flip-flop 26 so that at each clock cycle the value of the data stored in the storage device exactly equals the value of the data which is then propagating along the transmission line 10. Of course, since the value of the data at the output Q of the sending circuit 16 remains stored in the sending circuit 16, it is also held at a known state. The flip-flops 22, 24, and 26 are referred to jointly herein as data storage device 28.

Figure 3:
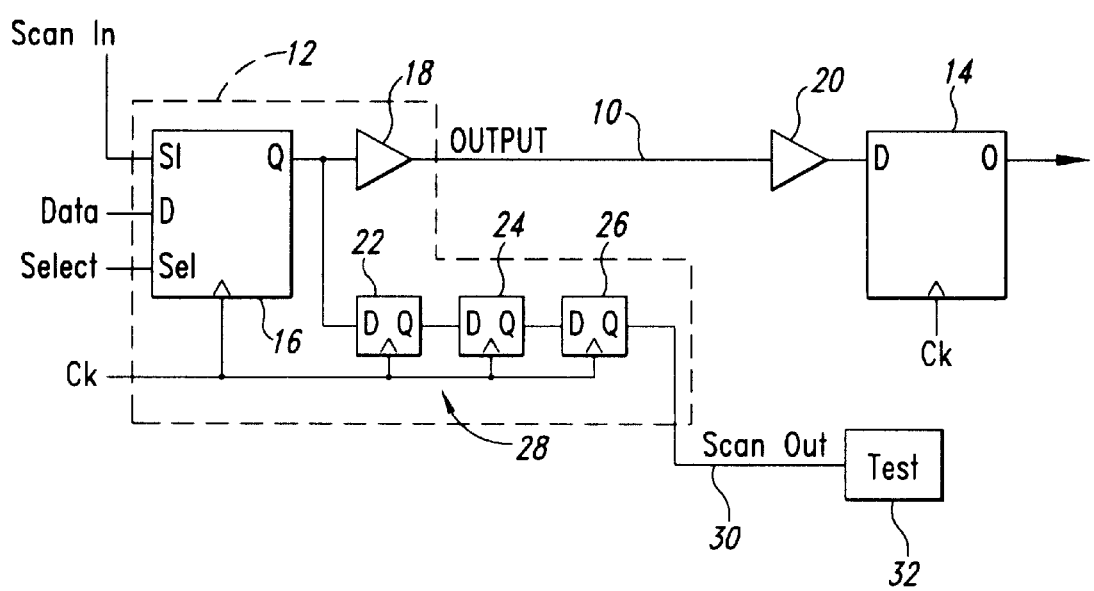
FIG. 3 is a block diagram of a transmission line and data storage device according to another embodiment of the present invention.

The use of data storage device 28 provides a number of distinct advantages and can be used in a variety of different ways. At each clock cycle, the data output on the scanout line from the data storage device 28 will be identical to the data being input to the receiving device 14 on that same clock cycle. Accordingly, as illustrated in FIG. 3, if it is desired to test the state of the data which is being received by circuit 14, the output of the scanout line can be tested. This permits simultaneous testing of the data while the device operates. It is not necessary to test the input or output of circuit 14 or otherwise interfere with its operation. Instead, the scanout line 30 can be easily connected to the appropriate test circuit 32 and the output monitored while the operation of the machine is observed.

According to a further embodiment of the present invention, the data in the data storage device 28 can also be used to initialize or preload the value on the transmission line 10 prior to the beginning of a certain operation. Assuming there is an interruption in operation, it may be desired to restart the computer in exactly the same state as when its operation was interrupted. To restart, prior to the actual data being presented at the D input of sending circuit 16, it is possible to connect the scanout line from data storage 28 to the scan in line of its sending circuit. Three clock cycles can then be carried out while the select signal is set at the state for selecting the scan in line so that the value provided at the output Q and put onto the transmission line 10 is exactly identical to the most recent state of the transmission line 10. Then, once the value of the data has been preloaded onto the transmission line 10 it has been returned to its prior state, the transmission line itself is initialized and on the next clock cycle it is prepared to receive new data. The select signal then changes state and the signal present at the data input line is transferred to the output Q of the sending circuit 16 so that operation may resume exactly in sequence with its last state of operation before interruption. This ability to initialize the transmission line themselves provides significant improvement in the reliability and speed of operation.

The value of the transmission line is stored at all times in the data storage device 28. In the event the operation of the computer is interrupted for whatever reason, whether because of a temporary power loss, turning OFF of the clock cycle, or other reason, the value of the data remains stored in storage device 28. The appropriate power remains provided to the storage element 28 or it is composed of nonvolatile memory cells which retain the data even if power supply is interrupted, any acceptable data storage device being suitable for use as the storage device 28. When it is desired to return to normal operation, it only takes a few clock cycles to initialize to its prior state the transmission line itself and then at a known selected clock cycle the data is presented on the data input line is selected for output. The operation of the computer resumes at exactly the same stage, with every node in the entire computer at its same state, and indeed, even the bits propagating along the transmission line being at the same state as when it last terminated operation.

Figure 2:
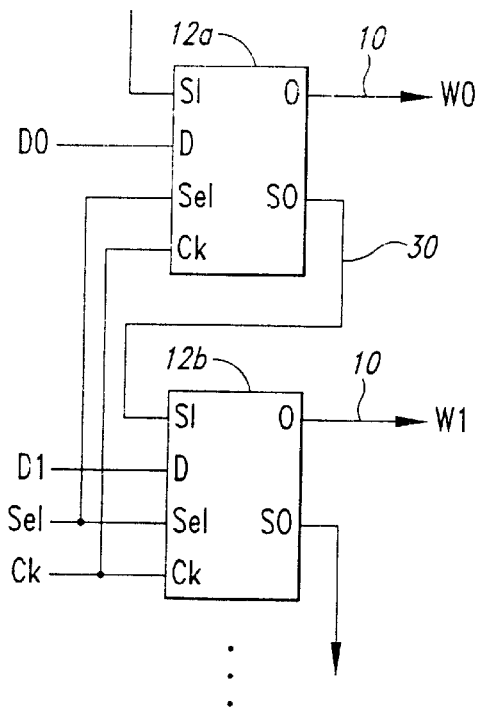
FIG. 2 is block diagram of an array of the circuits of FIG. 1 according to the invention.

According to principles of the present invention, the transmission line 10 represents one wire in a parallel bus having many wires or lines 10 passing information simultaneously from a sending circuit to a receiving circuit. In this case, each wire on the bus may be driven by its individual sending circuit 12a, 12b, etc. (FIG. 2). According to one embodiment of the present invention, the scanout line 30 of each sending circuit 12 is connected to the scan line of the subsequent receiving circuit 12. Further, the scan in of the first line 12a can be connected to the scanout line of the last sending circuit 12n in the sequence or can be provided from another source, particularly an input test signal.

The state of the select line SEL is set to provide either the scan in line signal or the data signal on the respective outputs W0, W1, . . . Wn. Accordingly, under control of the operation of the user or a central program, the data presented at each respective data input, data0, data1, datan, is provided on the data bus and transmitted to a receiving circuit (not shown) corresponding to each sending circuit. As desired, the state of the select signal can be set so that the output from each respective data storage device 28 is provided at the scan in line of the subsequent sending device 12 so that the transmission line 10 of each adjacent sending circuit 12 holds the same state as the previous state of the adjacent transmission line 10. This state can therefore be used as an initialization device to initialize each of the transmission lines 10 to a known state, either to the state of the adjacent transmission line, which is acceptable, or any other transmission line in the system merely by clocking the circuit the desired number of times. Of course, if the embodiment is selected in which the output of the last sending circuit 12 is connected to the scan in input of the first send in circuit 12, then after the appropriate number of click cycles each transmission line 10 can be preloaded with exactly the same data as their prior state. The computer can thus be initialized with each data node, including each receiving node and each transmission line, including multi-bits on a single transmission line to a predetermined state. As the bits propagate along the transmission line, the value of the select signal can be changed to place either the data signal or the scan in signal onto the transmission line at subsequent clock pulses, thus permitting testing, initialization, or other desired operation of this circuit.

The present invention is particularly applicable to large supercomputers of the type having many thousands or millions of transmission lines and operating at extremely high clock speeds. The transmission lines 10 throughout the supercomputer may each have a known length. The data storage device 28 has sufficient capacity to store the number of bits which may propagate simultaneously along its related transmission line 10, whether it be a short line and thus have two or three bits thereon, or a longer line, having many bits thereon. This assures that each transmission line 10 has its entire state stored at all times. The value of each transmission line in the entire system can therefore be tested or initialized as desired. The present invention thus permits state control of a transmission line within a computer system, whether the transmission line be sufficiently short to propagate one bit of data thereon or sufficiently long to propagate many bits of data thereon. The length of a transmission line can be measured based on the amount of time that it takes a bit to propagate along the transmission line as compared to the clock rate and the data storage device provided with the appropriate number of elements.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
    a signal sending circuit having an output line for outputting a plurality of digital bits in a series sequence at a selected rate to form a stream of serial bits;
    a transmission line receiving the serial bits and passing the bits sequentially from a first end of the transmission line to a second end of the transmission line, the transmission line having a known length and a known time for propagation of a single bit from a first end of the transmission line to a second end of the transmission line, the length of the transmission line being sufficiently long that a second bit is received on the transmission line before a previously received bit has passed to the second end of the transmission line;

a signal receiving circuit connected to the second end of the transmission line and receiving the transmitted bits; and a data storage device coupled to the output of the signal sending device and storing the digital bits positioned on the transmission line.

2. The apparatus according to claim 1 wherein the transmission line is a metal line of a selected length and a portion of the transmission line has a high bit thereon and another portion of the transmission line has a low bit thereon.

3. The apparatus according to claim 1 wherein the data storage device includes:

a group of digital storage elements, the number of elements in the group being equal to the number of data bits minus one that are simultaneously positioned in the transmission line such that the data bits stored in the respective elements correspond to the location of the data bits on the transmission line.

4. The apparatus according to claim 1 wherein the transmission line is a metal line having a length between 0.1 and 1 meter.

5. The apparatus according to claim 1 wherein the transmission line includes copper as an element.

6. The apparatus according to claim 1, further including:

a scanout line coupled to the data storage device.

7. The apparatus according to claim 6, further including:

a second signal sending circuit having a first input coupled to a data input line and a second input coupled to a scan in line and a output line, and the scan in line is coupled to the scanout line from the data storage device.

8. The apparatus according to claim 7, further including a select line coupled to the second signal sending circuit for selecting either the bits on the data input line or the bits on the scan in line to be provided on its output line.

9. The apparatus according to claim 6, further including a test circuit coupled to the scanout line to test the content of the bits stored in the data storage device.

* * * * *